United States Patent [19]

Jackson et al.

[11] Patent Number: 4,615,766

[45] Date of Patent: Oct. 7, 1986

[54] SILICON CAP FOR ANNEALING GALLIUM ARSENIDE

[75] Inventors: Thomas N. Jackson, Peekskill; Gwen Pepper, Croton-on-Hudson; Richard F. Rutz, Cold Spring, all of N.Y.

[73] Assignee: International Business Machines Corporation, Armonk, N.Y.

[21] Appl. No.: 705,959

[22] Filed: Feb. 27, 1985

[51] Int. Cl.$^4$ .......................................... H01L 21/265
[52] U.S. Cl. .................... 156/662; 148/1.5; 148/DIG. 84; 427/86; 427/87; 156/643; 250/492.3
[58] Field of Search ...................... 427/86, 87; 148/1.5; 156/662, 643; 204/192 SP

[56] References Cited

U.S. PATENT DOCUMENTS 4,267,014  5/1981  Davey .................................. 427/86

OTHER PUBLICATIONS

Antell, "The Diffusion of Silicon in Gallium Arsenide," Solid-State Electronics, Pergamon Press, vol. 8, pp. 943-946, 1965.
Greiner, "Diffusion of Silicon in Gallium Arsenide . . . " Appl. Phys. Lett., vol. 44, No. 8, Apr. 1984, pp. 750-752.
Donnelly "Silicon and Selenium Ion-Implanted GaAs . . . " Appl. Phys. Lett., vol. 27, No. 1, Jul. 1975, pp. 41-43.
Vaidyanathan et al., "Study of Encapsulants for Annealing GaAs," J. Electrochem. Soc.: Solid-State Science and Technology, Nov. 1977, pp. 781-784.
Wang, "Amorphous Gallium Arsenide as Caps for Ion Implantation and Annealing", IBM TDB, vol. 26, No. 10B, Mar. 1984, p. 5387.
Gansauge "Producing PNP-Type GaAs Transistors Having Extremely Thin Bases," IBM TDB, vol. 9, No. 1, Jun. 1966, p. 86.
Vieland, "The Effect of Arsenic on Impurities Diffusion in Gallium Arsenide, pp. 318, 319, 1961, RCA Semiconductor and Mtls. Div.
Anderson, "Smooth and Continuous Ohmic Contacts to GaAS . . . " J. Appl. Phys., 49(5) May 1978, pp. 2998.

Primary Examiner—John D. Smith
Attorney, Agent, or Firm—Perman & Green

[57] ABSTRACT

A method of manufacturing GaAs semiconductor devices includes the steps of emplacing doping impurities by ion implantation on at least one surface of a GaAs substrate, and a step of annealing to remove damage resulting from the implantation of the impurities in the GaAs material. Prior to the annealing, a silicon capping layer is deposited on the surface by either sputtering, evaporation, or vapor deposition to a thickness of 100-10,000 angstroms. Subsequent to the annealing, the silicon capping layer is removed by etching. The silicon cap prevents out-diffusion of arsenic from the GaAs, and has a coefficient of thermal expansion which is sufficiently close to that of the GaAs to inhibit the formation of cracks in the capping layer.

12 Claims, 1 Drawing Figure

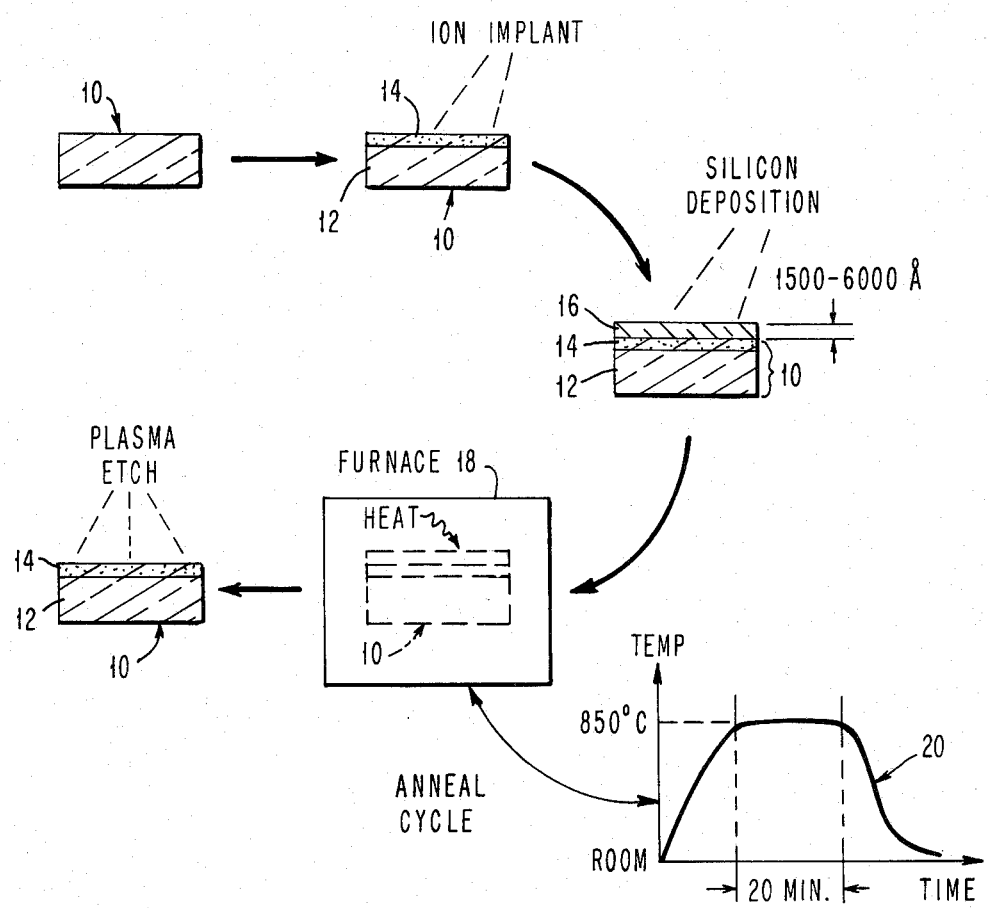

SILICON CAP FOR ANNEALING GALLIUM ARSENIDE

DESCRIPTION

1. Technical Field

This invention relates to the preparation of semiconductor material by a process including the steps of doping and annealing and, more particularly, to the coating of a doped gallium arsenide (GaAs) semiconductor device with a silicon coating during an annealing of the doped GaAs.

2. Prior Art

One class of semiconductor devices of considerable importance relates to devices formed of doped GaAs. In the preparation of GaAs devices, doping may be accomplished by a well known process of ion implantation of dopant elements such as Si, Se, Be, or Mg to a predetermined depth as is required to provide desired electrical characteristics to the device. Subsequent to the step of ion implanting the semiconductor material, it is necessary to anneal the semiconductor material to remove the damage caused by the implanted ions.

The annealing step is frequently done in the temperature range of 700°–1000° C. and presents difficulties due to the tendency for the GaAs to decompose incongruently with the emission of As. The surface of the semiconductor becomes excessively rich in Ga, and may even show droplets of Ga on the surface.

Different anufacturing processes have been employed in an attempt to prevent the loss of As. However, none has proved to be totally satisfactory, each providing some difficulty. As an example of such a manufacturing process arsine is introduced into an annealing furnace to provide an overpressure of As and thereby decrease the loss of the As from the semiconductor material. Unfortunately, arsine is a very toxic substance which presents serious safety problems for manufacturing personnel.

As another example, a thin capping material is applied to the surface of the GaAs with annealing done in a forming gas ambient. Currently used capping materials include $SiO_2$ and $Si_3N_4$ which reduce the hazards of toxicity but introduce undesirable side effects upon the semiconductor material such as strain, contamination, and lack of uniformity in layer reproduction. The side effects can affect the properties of an extremely thin implanted layer in highly purified GaAs used in modern very high frequency devices such as MESFETS and Schottky diodes.

SUMMARY OF THE INVENTION

The foregoing difficulties in the annealing process are overcome and other advantages are provided by an annealing process which, in accordance with the invention, employs a cap formed of silicon. The silicon cap retains the As within the semiconductor, and has a thermal expansion coefficient which more closely matches that of GaAs than other capping materials. Thus, less strain is introduced in the region of the semiconductor surface, and the layer of Si capping material is less likely to crack.

A further advantage is attained because the proposed cap is a single element making the reproduceability of the layer from wafer to wafer much better. Also, very pure silicon sputtering and evaporation sources are readily available.

The silicon cap is readily removed from the GaAs after the annealing step by plasma etching with $CF_4$ or $CF_4+O_2$. The $CF_4$ does not etch the GaAs and, accordingly, the etching process can go to completion without damage to the GaAs surface.

The success in the use of the silicon capping material upon the GaAs is surprising since silicon has been used as a dopant of GaAs and would be presumed to diffuse into the GaAs during the annealing step. Such diffusion, if excessive, would distort the profile of the implanted dopants, and result in an undesirable change in the physical and electrical properties of the semiconductor device. However, in the practice of the invention, the annealing step involves the raising and subsequent lowering of the temperature in a complete cycle wherein an annealing temperature of preferably 850° C. is maintained for approximately 20 minutes. The duration of the annealing step is sufficiently short so as to permit no more than an insignificant amount of diffusion of the silicon into the GaAs.

BRIEF DESCRIPTION OF THE DRAWING

The foregoing aspect and other features of the invention are explained in the following description, taken in connection with the accompanying drawing, wherein the sole FIGURE shows the steps in a wafer manufacturing process employing the invention.

DETAILED DESCRIPTION OF THE PREFERRED EMBODIMENT OF THE INVENTION

With reference to the drawing, there is shown the process of the invention for the construction of a semiconductor device formed of a crystalline gallium arsenide wafer 10 with a localized distribution of ion implanted impurities. The impurities provide desired electrical characteristics to the device. The GaAs wafer 10 has a substrate 12. The impurities typically are selected from dopant elements such as Si, Se, Be and Mg, and are placed in a layer 14 along the surface of the wafer 10 during a step of ion implantation which is accomplished in a well-known fashion by conventional implantation equipment. The impurities occupy sites within the lattice structure, their implantation introducing damage within the layer 14 of the semiconductor material. The damage is removed and the desired electrical characteristics are attained by a step of annealing at an elevated temperature in the range of approximately 700°–1200° C.

In accordance with a feature of the invention, the step of annealing is preceded by a step of encapsulation of the layer 14 with a relatively thin layer 16 of silicon, the layer 16 being sufficiently thick to prevent the escape of arsenic from the semiconductor material under the annealing conditions. Silicon is advantageous because the coefficient of thermal expansion of the silicon is sufficiently close to that of GaAs, being approximately $\frac{2}{3}$ that of GaAs, so as to bond well to the GaAs during the annealing process in spite of thermal expansions induced in each of the two layers 14 and 16 by the annealing conditions. A thickness of the silicon layer 16 in the range of 100–10,000 angstroms is adequate for containing the arsenic.

A further advantage in the use of silicon as the encapsulant is the reduced chance for the development of cracks as compared to other capping materials such as $SiO_2$ and $Si_3N_4$. Also, the silicon can be obtained in a pure form which permits accurate control of the composition of the cap provided by the layer 16 for more uniform results from run to run in the manufacturing process. The silicon cap can be applied to the GaAs by any one of the well known processes of sputtering, evaporation, and vapor deposition. Silicon can be readily removed from the GaAs by plasma etching with $CF_4$ or a mixture of $CF_4+O_2$. The desired selectivity in etching between silicon and GaAs is observed and/or expected for most fluorine based etchants, such as $SF_6$ and $C_2F_6$. The $CF_4$ does not etch the GaAs, thereby permitting complete removal of the encapsulating layer 16 after the annealing process to insure attainment of the expected electrical characteristics.

As shown in the drawing, the steps of implantation and capping are followed by the step of annealing, which step takes place in a furnace 18. In the annealing process, the temperature is cycled from room or ambient to a value of approximately 850° C. and back to room temperature. The annealing temperature of approximately 850° C. is maintained for an annealing interval of approximately twenty minutes, as is shown in a graph 20 appended adjacent the furnace 18. The methodology of the invention applies generally to annealing situations wherein a nondiffusing Si cap is useful, and includes also rapid thermal annealing (annealing times of approximately 5–500 seconds), and laser annealing and electron beam annealing (annealing times of approximately 1 nanosecond to 1 millisecond). The duration of the annealing interval is sufficient to remove damage in the lattice structure caused by the implantation of the dopant impurities. However, in accordance with the invention, the annealing interval is sufficiently short to prevent all but an insignificant amount of diffusion of silicon from the cap layer 16 into the GaAs of the ion implantation layer 14.

After completion of the annealing step, the manufacturing process continues with the final step of etching away the silicon cap layer 16 by a well known process of plasma etching using $CF_4$ or $CF_4+O_2$ as the etchant. As noted above, the $CF_4$ does not etch the GaAs in the ion implantation layer 16. Therefore, the etching process can be allowed to go to completion with complete removal of the silicon without danger of damaging the layer 16. This completes the process of fabricating the GaAs wafer 10 with the required layer 14 of impurities for providing the desired electrical characteristics.

While the aforementioned thickness of the silicon cap layers 16 is adequate to prevent ecape of the As from the GaAs, it is noted that with thinner layers such as a layer having a thickness of approximately 100 angstroms, the presence of arsenic in the annealing environment is sufficient to induce some in-diffusion of silicon into the GaAs. The in-diffusion of silicon in the presence of arsenic results in a change in the implanted profile in the GaAs. However, the thinner layer of the silicon is sufficient to protect the GaAs surface from erosion during the annealing process.

Accordingly, should it be desirable in some manufacturing processes to reshape the profile of the implanted impurities, such reshaping can be accomplished by [using the thinner layer for the silicon cap.

It should be noted that the capping of the invention is useful even with modifications of the foregoing manufacturing process. For example, the Si layer can be applied before the ion implantation step in a situation such as that wherein the ion implantation is done directly through the capping layer to obtain a different doping profile. The capping can also be done with a Si layer having a small impurity content such as a small amount of oxygen or nitrogen or both because a layer with such impurity is still well matched to the GaAs.

It is believed that the use of the foregoing silicon capping layers on GaAs includes layers for protection or passivation as well as for ion implantation capping. For example, the compatibility by Si and the well established technology of processing it makes it an excellent candidate for protecting GaAs wafers for storage purposes. That is to say, GaAs wafers after polishing are extremely sensitive to surface contamination and damage. Yet they often must be stored after this step for periods of time long enough to be affected by environmental conditions to which they are subjected. Coating with Si immediately after the final polishing step can serve as a protection against contamination and mechanical damage. The Si is easily removed by plasma etching before device processing, or may be left on as a passivating layer if desired.

Experiments have been performed on semi-insulating GaAs wafers implanted with Si at 150 Kev on with a density of $3\times10^{12}$ atoms per $cm^2$ of surface layer, and also with implantation of SiF at 85 Kev with a density of $1.4\times10^{12}$ molecules per $cm^2$ of surface layer. The implanted wafers were annealed in a furnace with a flow of 90% Ar and 10% H at 850° C. for 20 minutes. Schottky diodes were made on these wafers by the foregoing process utilizing an annealing step carried out in accordance with the invention as well as an annealing step conducted with conventional annealing without encapsulation, and with $Si_3N_4$ encapsulation. Subsequent measurements of depth and impurity concentration showed essentially identical profiles indicating that even for very shallow implants, negligible diffusion of silicon from the capping layer takes place.

It is noted that in the use of the invention, there is no need to provide a pressurized arsenic environment within the annealing furnace to prevent any out-diffusion of arsenic from the GaAs. Thus, the manufacturing process is free from the use of the toxic material, arsine. Also, the handling of a cap made of a monoelemental material, silicon, is more readily accomplished than the use of material composed of multiple elements, particularly with respect to use at elevated temperatures.

Thus, the foregoing description of the invention has provided for an annealing step in the manufacture of GaAs devices which increases the yield of the manufacturing process, is safer than previous methods, and is more economical to use.

It is to be understood that the above described embodiment of the invention is illustrative only and that modifications thereof may occur to those skilled in the art. Accordingly, this invention is not to be regarded as limited to the embodiment disclosed herein, but is to be limited only as defined by the appended claims.

Having thus described our invention, what we claim as new, and desire to secure by Letters Patent is:

1. A method of forming an ion implanted GaAs device comprising:
   implanting ions into at least one surface of a GaAs substrate;
   depositing a capping layer of silicon upon said one surface;
   annealing said substrate, said capping layer retaining arsenic in said GaAs during said annealing; and
   etching said silicon capping layer to remove the silicon from said substrate.

2. A method according to claim 1 wherein said annealing is done at an elevated temperature of approximately 700–1200 celsius for a duration of approximately 1 nanosecond to 100 minutes.

3. A method according to claim 1 wherein in said step of depositing, said capping layer is deposited to a thickness in the range of 100–10,000 angstroms.

4. A method according to claim 1 wherein said etching employs a fluorine-based etchant.

5. A method of forming an ion implanted GaAs device comprising:
   implanting ions into at least one surface of a GaAs substrate;
   depositing a capping layer of silicon upon said surface to a thickness in the range of 100–10,000 angstroms;
   annealing said substrate, said capping layer retaining arsenic in said GaAs during said annealing; and
   etching said silicon capping layer with fluorine-based etchant to remove the silicon from said substrate.

6. A method according to claim 5 wherein said annealing is done at a temperature up to 1200° Celsius.

7. A method according to claim 5 wherein said surface is cleaned and polished before said step of depositing said caping layer of silicon.

8. A method according to claim 5 wherein said depositing is accomplished by sputtering silicon, evaporating silicon, or by vapor deposition of silicon onto said surface of said substrate to form an adhering layer thereon.

9. A method according to claim 8 wherein said annealing is done at a temperature in the range of 700°–1200° Celsius with a duration of annealing time being approximately 1 nanosecond to 100 minutes.

10. In a process of establishing a localized distribution of impurities in a gallium arsenide semiconductor crystal through implantation of ions followed by annealing, the improvement comprising:
    applying a capping layer of silicon over the surface of said gallium arsenide crystal; through which crystal said ions were implanted into said crystal; and
    subjecting the combination of said crystal and said silicon layer to an annealing temperature cycle in an ambient free from over pressure of arsenic, said capping layer retaining arsenic in said GaAs during said annealing temperature cycle.

11. In a process according to claim 10, the improvement further comprising the step of etching the silicon of said silicon capping layer with fluorine-based etchant for removal of the silicon from said semiconductor crystal.

12. In a process according to claim 10 the improvement wherein said applying of the capping layer provides a layer thickness in the range of 100–10,000 angstroms, and wherein said annealing is accomplished in a temperature range of approximately 700°–1200° Celsius over a time duration of approximately 1 nanosecond to 100 minutes.

* * * * *